(12) United States Patent
Shaeffer et al.

(10) Patent No.: US 7,412,923 B2
(45) Date of Patent: Aug. 19, 2008

(54) STENCIL DEVICE FOR ACCURATELY APPLYING SOLDER PASTE TO A PRINTED CIRCUIT BOARD

(75) Inventors: Ian P. Shaeffer, San Jose, CA (US);
Everett Basham, Sunnyvale, CA (US);
Christopher D. Price, Campbell, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 179 days.

(21) Appl. No.: 10/654,066

(22) Filed: Sep. 3, 2003

(65) Prior Publication Data

US 2004/0041001 A1 Mar. 4, 2004

Related U.S. Application Data

(62) Division of application No. 09/561,591, filed on May 1, 2000, now Pat. No. 6,664,482.

(51) Int. Cl.
*B05C 17/06* (2006.01)

(52) U.S. Cl. .................. 101/127; 118/213; 118/406; 427/282

(58) Field of Classification Search ............ 101/114, 101/127, 128.4; 427/282; 118/213, 406
See application file for complete search history.

(56) References Cited

U.S. PATENT DOCUMENTS

| | | | | |
|---|---|---|---|---|
| 3,769,908 | A | * 11/1973 | Griffin | ............ 101/127 |
| 4,270,465 | A | * 6/1981 | Lim | ............ 101/127 |
| 4,528,064 | A | 7/1985 | Ohsawa et al. | |
| 5,011,066 | A | 4/1991 | Thompson | |
| 5,260,518 | A | 11/1993 | Tanaka et al. | |
| 5,325,629 | A | 7/1994 | Hsu | |
| 5,395,643 | A | 3/1995 | Brown et al. | |
| 5,404,637 | A | 4/1995 | Kawakami | |
| 5,436,028 | A | 7/1995 | Becher et al. | |
| 5,463,191 | A | 10/1995 | Bell et al. | |
| 5,509,597 | A | 4/1996 | Laferriere | |
| 5,543,584 | A | 8/1996 | Handford et al. | |
| 5,553,538 | A | 9/1996 | Freitag | |
| 5,740,730 | A | 4/1998 | Thompson, Sr. | |
| 5,743,007 | A | 4/1998 | Onishi et al. | |
| 5,804,248 | A | 9/1998 | Hewett | |

(Continued)

*Primary Examiner*—Ren Yan

(57) ABSTRACT

A stencil device ensures that solder paste is accurately applied to a printed circuit board to create a substantially zero signal degradation solder bridge electrical connection. The printed circuit board is defined by a dielectric structure core having a first surface which further includes a first conducting pad having an edge and a second conducting edge having an edge separated from and adjacent to the edge of the first conducting pad. The edges of the first and second conducting pads define therebetween a surface area of the first surface. The stencil device includes a stencil plate member defining a first opening sized to substantially correspond to the first conducting pad, a second opening sized to substantially correspond to the second conducting pad, and a third opening. The third opening links the first opening to the second opening at a size to correspond to a partial portion of the surface area of the first surface between the edges of the first and second conducting pads. The stencil device ensures that solder paste flows through the first, second, and third openings onto the first and second conducting pads and the first surface of the dielectric structure core to form a substantially zero signal degradation electrical connection between the first and second conducting pads.

8 Claims, 4 Drawing Sheets

U.S. PATENT DOCUMENTS

| | | |
|---|---|---|
| 5,867,898 A | 2/1999 | Lauffer et al. |
| 6,020,561 A | 2/2000 | Ishida et al. |
| 6,026,566 A | 2/2000 | Urban et al. |
| 6,091,155 A | 7/2000 | Jonaidi |
| 6,165,596 A | 12/2000 | Chen et al. |
| 6,259,608 B1 | 7/2001 | Berardinelli et al. |
| 6,320,139 B1 | 11/2001 | Byle et al. |
| 6,664,482 B1 * | 12/2003 | Shaeffer et al. .............. 174/261 |
| 6,977,440 B2 * | 12/2005 | Pflughaupt et al. ........... 257/777 |

* cited by examiner

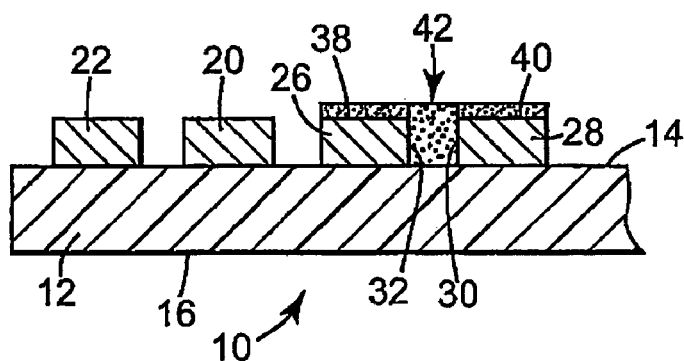
Fig. 6
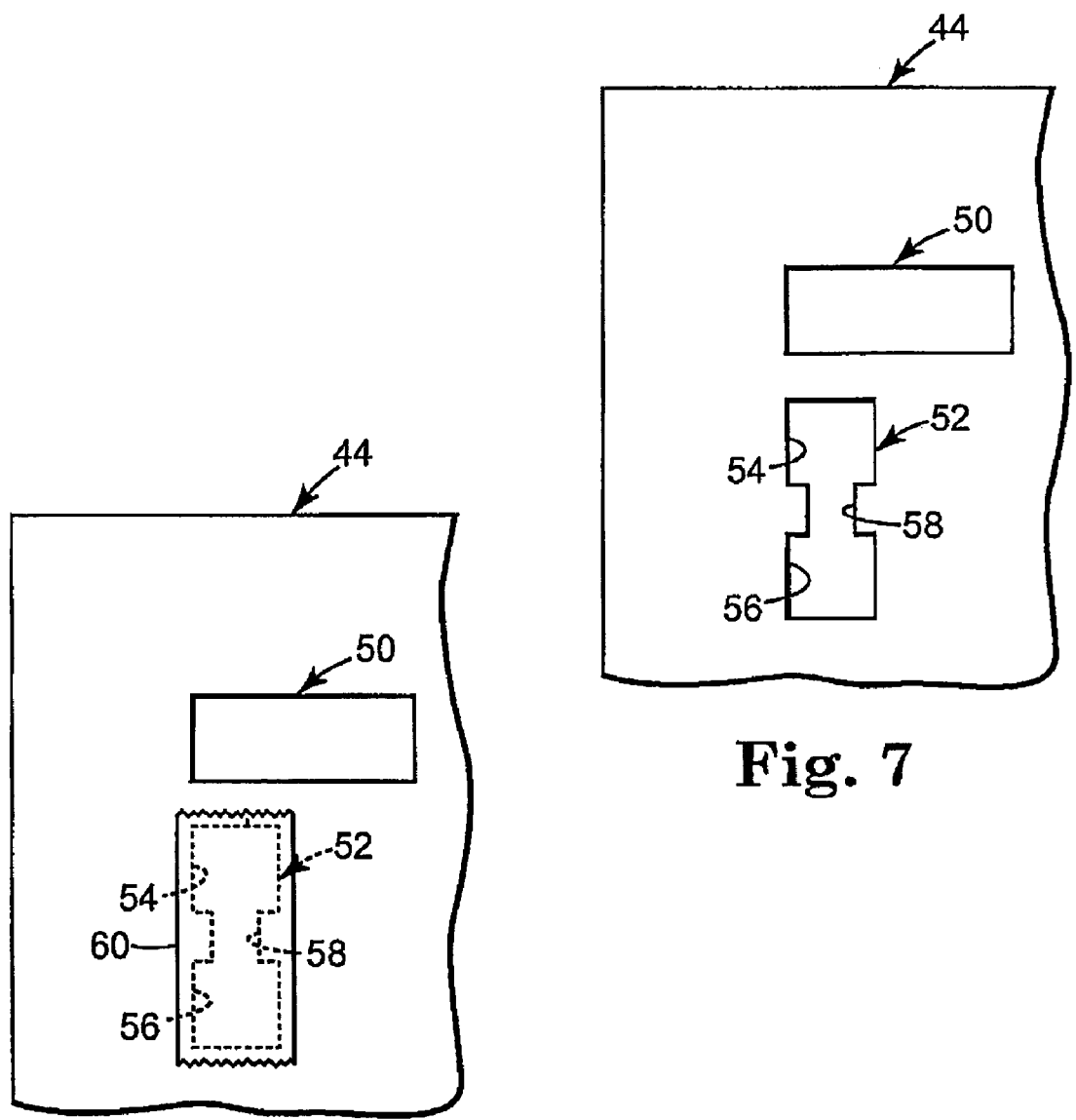
Fig. 7
Fig. 8

STENCIL DEVICE FOR ACCURATELY APPLYING SOLDER PASTE TO A PRINTED CIRCUIT BOARD

This application is a divisional application of U.S. patent application Ser. No. 09/561,591, filed on May 1, 2000, now U.S. Pat. No. 6,664,482.

BACKGROUND OF THE INVENTION

This invention relates to printed circuit boards. In particular, the present invention is a method of fabricating a high signal integrity, "solder bridge" electrical connection for connecting conducting pads of a printed circuit board, and a printed circuit board having at least one solder bridge for electronically connecting adjacent printed circuit board conducting pads. The solder bridge forms a reliable and secure electrical connection between adjacent conducting pads without the need for electronic components such as zero ohm resistors, dip switches and/or jumper block/header arrays.

Printed circuit boards (PCB's) with electrical components are widely used in the electronics industry in a variety of products including computers, televisions and telecommunication devices. PCB's are typically manufactured in a two step process. First, the actual PCB "blank" is fabricated from multiple layers of materials and copper traces. The copper traces typically terminate in conducting through-holes or conducting pads to which electrical components can be attached to the PCB blank. In the second part of the PCB manufacturing process, these electrical components, such as resistors, capacitors, microchips, etc. are attached to the PCB blank. Through-hole electrical components are generally attached to the conducting through holes of the PCB blank using through-hole processes, while surface mount electrical components are attached to the conducting pads of the PCB blank using surface mount processes.

In typical through-hole mounting processes, the leads of the electrical components are passed through the conducting through-holes in the PCB blank so that the ends of the leads extend beyond a bottom side of the PCB blank. The ends of the leads are then soldered to the bottom side of the PCB blank by a solder wave in which molten solder flows across the bottom side of the PCB blank. The molten solder fills the voids between the electrical component leads and the conducting through-holes to form conductive bonds between the leads and the conducting through-holes on the PCB blank.

In typical surface mounting processes, a solder paste is applied to the conducting pads of the PCB blank through a stencil patterned with openings corresponding to the PCB blank conducting pad locations. Typically, the solder paste is screen deposited onto the conducting pads using the stencil as a mask and a blade to squeegee the solder paste through the holes in the stencil. When the stencil is removed, the solder paste remains on the conducting pads of the PCB blank. Next, the leads of the electrical components are placed on the soldered conducting pads, and the solder paste is subjected to reflow soldering to adhere the leads to the conducting pads. To prevent solder shorts (i.e., the unwanted formation of an electrical connection between conducting pads), due to the imprecise application of the soldering paste or the unwanted flow of solder during the reflow soldering process, the conducting pads are often fabricated on the PCB blank so as to have an edge-to-edge conducting pad separation of between 20-100 mils with a minimum edge-to-edge conducting pad separation of at least 12 mils.

During the process of mounting electrical components to the PCB blank, it is often necessary to simply electrically connect conducting pads to one another with acceptable parasitic capacitance and inductance. Typically, to electrically connect conducting pads in this fashion, it is necessary to use a "load/no-load" process to mount a separate electrical component to the PCB blank after the application of the soldering paste and before the reflow soldering procedure. Types of components that are typically used are "zero ohm resistors", "dip switches" and "header array/jumper blocks".

Although any one or all of these components can provide the desired electrical connection between conducting pads there are drawbacks to the use of these types of electrical components. For example, all of these solutions to providing an electrical connection, with acceptable parasitic capacitance and inductance, between conducting pads requires the use of separate electrical components (i.e., extra parts). These extra parts increase the overall cost of manufacturing the PCB. Moreover, these extra parts are susceptible to damage during routine handling of the PCB that may adversely affect the operation of the PCB. In addition, these extra parts are susceptible to becoming dislodged or inadvertently misaligned during the reflow soldering process which can adversely affect the electrical connection formed by these separate electrical components and the subsequent operation of the PCB. Further, these separate electrical components take up valuable PCB surface area and degrade the integrity of the electrical signal between the conductor pads connected by these components. Still further, PCB's employing these separate electrical components are not easily reconfigurable during the PCB manufacturing process, since to accomplish such a task typically requires the addition of automated equipment and/or the reprogramming of automated equipment for mounting these components onto the PCB blank in the desired reconfigured format. Lastly, the design of these separate electrical components limits their PCB mounting configurations, and as such, typically necessitates that these components be mounted to the PCB either parallel (i.e., 180°) or at a 90° angle with respect to other components on the PCB.

There is a need for PCB's having substantially zero signal degradation electrical connections that minimize parasitic capacitance and inductance between connected conducting pads, and a method of fabricating such substantially zero signal degradation electrical connections between conducting pads of a PCB. In particular, there is a need for PCB's having these substantially zero signal degradation electrical connections and a method of fabricating these electrical connections between conducting pads that does not require the use of separate electrical components (such as "zero ohm resistors", "dip switches" and "header array/jumper blocks) and thereby reduces the cost of manufacturing the PCB. These substantially zero signal degradation electrical connections should not be susceptible to damage during routine handling of the PCB that may adversely affect the operation of the PCB. In addition, these substantially zero signal degradation electrical connections should not be susceptible to becoming dislodged or inadvertently misaligned during the PCB manufacturing process. Further, these substantially zero signal degradation electrical connections should not take up valuable PCB surface area, nor should these electrical connections degrade the integrity of the electrical signal between connected PCB conducting pads. Still further, it should be relatively easy to reconfigure the PCB during the manufacturing process to eliminate, add or change the configuration of these substantially zero signal degradation electrical connections without adding automated equipment and/or reprogramming automated equipment for mounting electrical components onto the PCB blank. Lastly, these substantially zero signal degradation electrical connections should be rotatable through any angle so as to be mountable to the PCB at any angle (not just 90° and 180°) to allow the PCB to employ various conducting pad geometries and groupings to take advantage of available PCB surface space.

SUMMARY OF THE INVENTION

A stencil device ensures that solder paste is accurately applied to a printed circuit board to create a substantially zero signal degradation solder bridge electrical connection. The printed circuit board is defined by a dielectric structure core having a first surface which further includes a first conducting pad having an edge and a second conducting edge having an edge separated from and adjacent to the edge of the first conducting pad. The edges of the first and second conducting pads define therebetween a surface area of the first surface. The stencil device includes a stencil plate member defining a first opening sized to substantially correspond to the first conducting pad, a second opening sized to substantially correspond to the second conducting pad, and a third opening. The third opening links the first opening to the second opening at a size to correspond to a partial portion of the surface area of the first surface between the edges of the first and second conducting pads. The stencil device ensures that solder paste flows through the first, second, and third openings onto the first and second conducting pads and the first surface of the dielectric structure core to form a substantially zero signal degradation electrical connection between the first and second conducting pads.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principals of the invention. Other embodiments of the present invention and many of the intended advantages of the present invention will be readily appreciated as the same become better understood by reference to the following detailed description when considered in connection with the accompanying drawings, in which like reference numerals designate like parts throughout the figures thereof, and wherein:

FIG. 6 is a sectional view taken along line 6-6 in FIG. 3 illustrating the alternative embodiment of the substantially zero signal degradation solder bridge electrical connection.

FIG. 7 is a top elevational view illustrating a stencil, in accordance with the present invention, for fabricating the substantially zero signal degradation solder bridge electrical connections illustrated in FIGS. 2 and 3.

FIG. 8 is a top elevational view similar to FIG. 7 of the stencil with an opening masked off with tape.

DETAILED DESCRIPTION OF THE PREFERRED EMBODIMENTS

Figure 1:
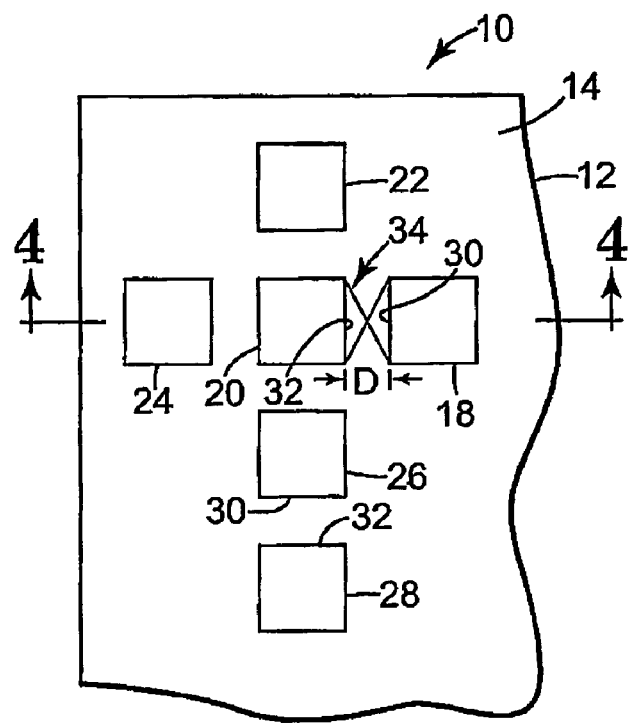
FIG. 1 is a top elevational view illustrating a portion of a printed circuit board having a plurality of conducting pads.
Figure 4:
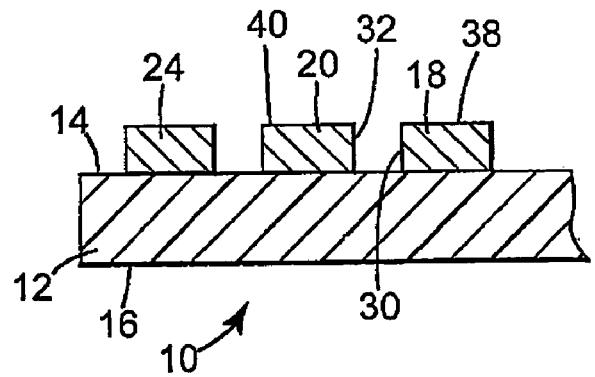
FIG. 4 is a sectional view taken along line 4-4 in FIG. 1.

FIGS. 1 and 4 illustrate a portion of a printed circuit board blank or product 10, in accordance with the present invention, defined by a dielectric structure core 12 having a first surface 14 and an opposite second surface 16 (see FIG. 4). As seen best in FIG. 1, the first surface 14 of the dielectric structure core 12 includes a plurality of conducting pads 18, 20, 22, 24, 26 and 28. In one preferred embodiment, the conducting pads 18-28 are copper traces that have been selectively patterned on the first surface 14 of the dielectric structure core 12 using conventional photolithographic processes. It is to be understood that although only six conducting pads 18-28 are illustrated, the printed circuit board product 10 can have any number of these conducting pads.

The present invention will now be described with reference to adjacent conducting pads 18 and 20, but it is to be understood that the following applies to any adjacent pair of conducting pads 18-28. As seen best in FIG. 1, first conducting pad 18 has an adjoining edge 30 that is separated from but immediately adjacent to an adjoining edge 32 of second conducting pad 20. The adjoining edges 30 and 32 of the first and second conducting pads 18 and 20 define therebetween a surface area 34 (represented by the "X" area in FIG. 1) of the first surface 14 of the dielectric structure core 12.

In one preferred embodiment, each of the conducting pads 18-28 is generally square having an edge length of 30 mils. Further, in one embodiment, the adjoining edges 30 and 32 of the first and second conducting pads 18 and 20, respectively, are separated by a pad edge 30 to pad edge 32 separation distance "D" (see FIG. 1) of less than 12 mils. Ideally, this pad edge-to-pad edge separation distance "D" is between 3 mils. and 10 mils., with the preferred pad edge-to-pad edge separation distance "D" being 8 mils. As such the surface area 34 between the adjoining edges 30, 32 of the first and second conducting pads 18, 20 is approximately 240 square mils.

In prior art printed circuit boards, the pad edge-to-pad edge separation distance "D" is typically between 20-100 mils with a minimum pad edge-to-pad edge separation distance "D" of 12 mils. As such, the ideal 8 mils. pad edge-to-pad edge separation distance "D" of the preferred embodiment of the present invention allows for a more compact printed circuit board design.

Figure 2:
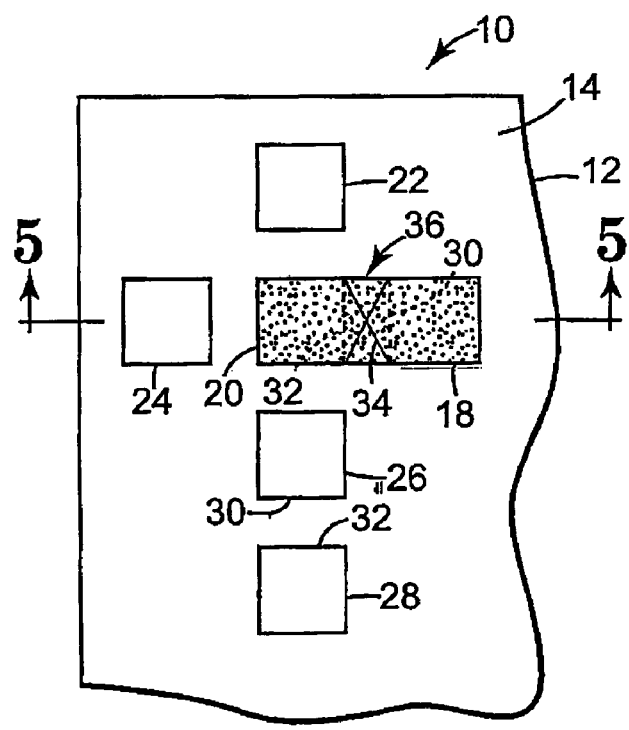
FIG. 2 is a top elevational view similar to FIG. 1 illustrating a preferred embodiment of the substantially zero signal degradation solder bridge electrical connector for electrically connecting adjacent conducting pads in accordance with the present invention.
Figure 5:
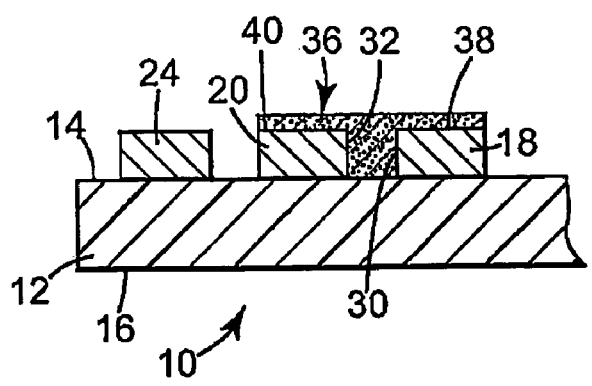
FIG. 5 is a sectional view taken along line 5-5 in FIG. 2 illustrating the preferred embodiment of the substantially zero signal degradation solder bridge electrical connection.

FIGS. 2 and 5 illustrate a preferred embodiment of a substantially zero signal degradation solder bridge electrical connection 36 (speckled area in FIGS. 2 and 5), in accordance with the present invention, for electrically connecting together the first and second conducting pads 18, 20 to permit signal transmission therebetween. As seen best in FIG. 2, the substantially zero signal degradation solder bridge electrical connection 36 substantially covers the first and second conducting pads 18, 20 and substantially all of the surface area 34 of the first surface 14 of the dielectric structure core 14 between the adjoining edges 30, 32 of the pads 18, 20. As seen in FIG. 5, this solder bridge 36 extends over upper surfaces 38 and 40 of the conducting pads 18, 20, respectively, and over the first surface 14 of the dielectric structure core 12 between the adjoining edges 30, 32. Fabrication of this solder bridge 36 will be described in detail below.

Figure 3:
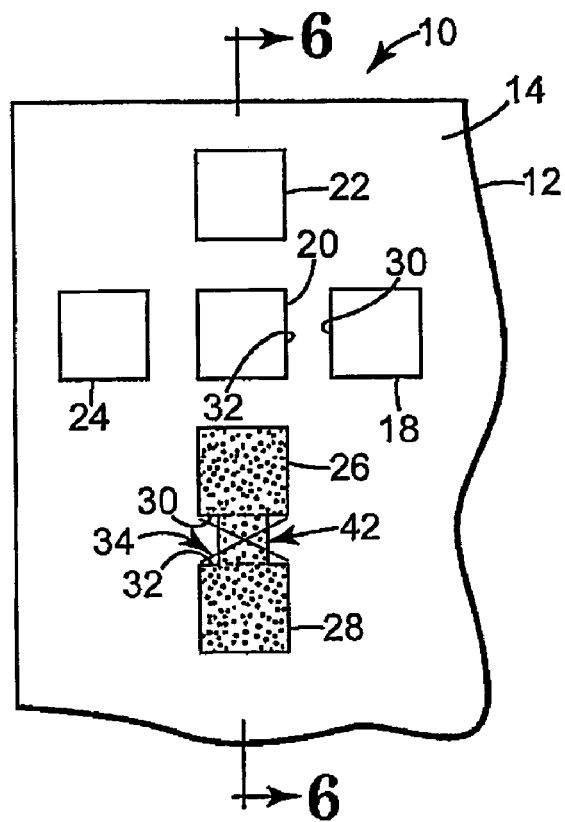
FIG. 3 is a top elevational view similar to FIG. 1 illustrating an alternative embodiment of the substantially zero signal degradation solder bridge electrical connector for electrically connecting adjacent conducting pads in accordance with the present invention.

FIGS. 3 and 6 illustrate an alternative embodiment of a substantially zero signal degradation solder bridge electrical connection 42 (speckled area in FIGS. 3 and 6), in accordance with the present invention, for electrically connecting together the third and fourth conducting pads 26 and 28 to permit signal transmission therebetween. As seen best in FIG. 3, the substantially zero signal degradation solder bridge electrical connection 42 substantially covers the third and fourth conducting pads 26, 28 but only partially covers the surface area 34 of the first surface 14 of the dielectric structure core 14 between the adjoining edges 30, 32 of the pads 26, 28. As seen in FIG. 5, this solder bridge 42 extends over upper surfaces 38 and 40 of the conducting pads 26, 28, respectively, and over the first surface 14 of the dielectric structure core 12 between the adjoining edges 30, 32. It is to be understood that although the solder bridge 42 is shown centered on the conducting pads 26, 28, the solder bridge 42 can be offset to one side or the other, or the solder bridge 42 could extend diagonally between the pads 26, 28. It is only important that the solder bridge 36, 42 bridge the surface area 34 between the adjoining edges 30, 32 of the conducting pads 18-28. Fabrication of this solder bridge 42 will be described in detail below.

Figure 9:
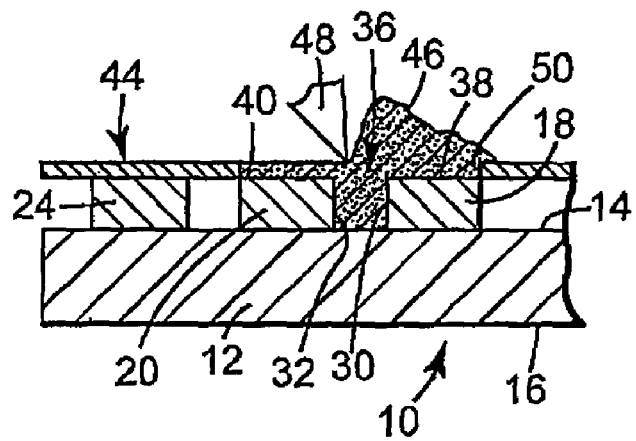
FIG. 9 is a sectional view similar to FIG. 5 illustrating a method of fabricating the preferred embodiment of the substantially zero signal degradation solder bridge electrical connection using the stencil shown in FIG. 8.

FIG. 7 illustrates a portion of a stencil plate member 44, in accordance with the present invention for insuring that solder paste 46 (see FIG. 9) is accurately applied to the first surface 14 of the dielectric structure core 12 of the printed circuit board product 10 to fabricate the substantially zero signal degradation solder bridge electrical connections 36 and 42. As seen best in FIG. 9, the solder paste 46 is applied in a known manner by way of a conventional solder paste application mechanism 48. As seen in FIG. 7, the stencil plate member 44 defines a first opening 50 sized to substantially correspond to the first conducting pad 18, the second conducting pad 20 and substantially the entire surface area 34 of the first surface 14 between the edges 30, 32 of the first and second conducting pads 18, 20, such that upon application of solder paste 46 to the stencil plate member 44, the solder paste 46 flows through the opening 50 and onto the first and second conducting pads 18, 20 and the first surface 14 of the dielectric structure core 12 to form the substantially zero signal degradation electrical connection 36 between the first and second conducting pads 18, 20.

As seen in FIG. 7, the stencil plate member 44 also defines a second opening 52 having a first open portion 54 sized to substantially correspond to the third conducting pad 26, a second open portion 56 sized to substantially correspond to the fourth conducting pad 28 and a third open portion 58 that links the first open portion 54 to the second open portion 56 and is sized to correspond to a partial portion of the surface area 34 of the first surface 14 between the edges 30, 32 of the third and fourth conducting pads 26, 28, such that upon application of solder paste 46 to the stencil plate member 44, the solder paste 46 flows through the first, second and third open portions 54, 56, 58 of the second opening 52 and onto the third and fourth conducting pads 26, 28 and the first surface 14 of the dielectric structure core 12 to form the substantially zero signal degradation electrical connection 42 between the third and fourth conducting pads 26, 28.

As seen in FIG. 8, it is relatively easy to reconfigure the printed circuit board product 10 during the manufacturing process since the reconfiguring of any substantially zero signal degradation electrical connections 36, 42 only requires modification of the stencil 44 which may in some instances be accomplished simply by masking off with tape 60 unwanted solder bridge connection openings (such as solder bridge connection opening 52) on the stencil 44.

Figure 10:
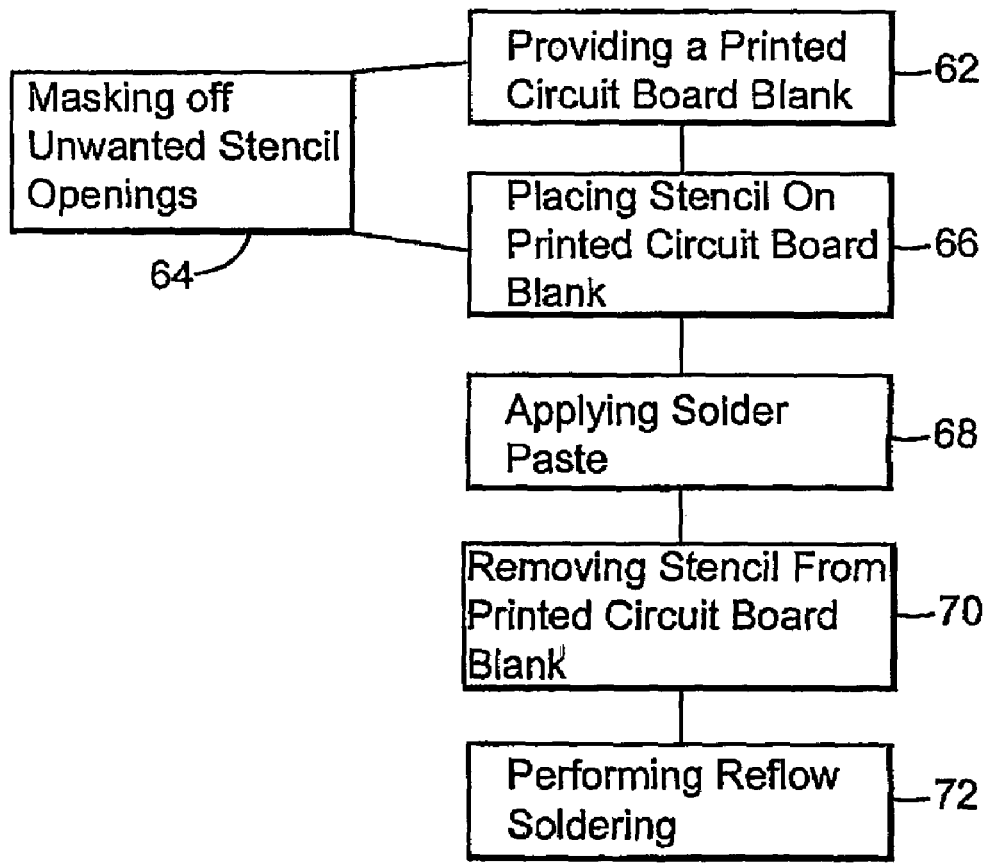
FIG. 10 is a flow chart illustrating the method of fabricating the substantially zero signal degradation solder bridge electrical connection in accordance with the present invention.

In practice, as illustrated in FIG. 10, the substantially zero signal degradation solder bridge electrical connections 36, 42 are fabricated using the following method. First, as represented by reference numeral 62, a printed circuit board product 10 defined by a dielectric structure core 12 having a first surface 14, conducting pads 18-28 having adjoining edges 30, 32 that define therebetween a surface area 34 of the first surface 14 is provided. Next, as represented by reference numeral 64, if desired unwanted solder bridge fabricating openings 50, 52 in the stencil plate member 44 can be masked off using a piece of tape 60 to prevent solder paste from flowing through the these openings and onto select conducting pads 18-28. If it is not necessary to modify the printed circuit board product 10, then this step 64 is simply omitted and fabrication proceeds with the next step 66. In step 66, the stencil 44 is placed on the first surface 14 of the dielectric structure core 12 with the solder bridge fabricating openings 50, 52 aligned with the appropriate conducting pads 18-28. In this example, the fabricating opening 50 would be aligned with the first and second conducting pads 18, 20, and the fabricating opening 52 would be aligned with the third and fourth conducting pads 26, 28.

Next, as represented by reference numeral 68, the solder paste 46 is applied on the conducting pads 18, 20, 26, 28 and on the first surface 14 of the dielectric structure core 12. The solder paste 46 applied through the fabricating opening 50 covers the entire surface area 34 between the adjoining edges of the pads 18, 20 (see FIG. 2). The solder paste 46 applied through the fabricating opening 52 only partially covers the surface area 34 between the adjoining edges of the pads 18, 20 (see FIG. 3). Next, as represented by reference numeral 70, the stencil 44 is removed from the first surface 14 of the dielectric core 12 leaving the previously described solder paste bridge formations on the pads 18, 20, 26, 28 and on the first surface 14. Last, as represented by reference numeral 72, reflow soldering of the solder paste applied to the conducting pads 18, 20, 26, 28 and the surface area 34 of the first surface 14 of the dielectric structure core 12 is preformed, thereby fabricating the substantially zero signal degradation solder bridge electrical connections 36, 42 between the conducting pads 18, 20 and 26, 28 and completing the fabrication process.

The method of fabricating the substantially zero signal degradation solder bridge electrical connections 36, 42 for connecting conducting pads 18-28 of the printed circuit board product 10, and the printed circuit board 10 having at least one of these solder bridges 36, 42 in accordance with the present invention do not require the use of separate electrical components (such as "zero ohm resistors", "dip switches" and "header array/jumper blocks"). As such the cost of fabricating such a printed circuit board 10 is reduced. In addition, since this substantially zero signal degradation solder bridge electrical connection 36, 42 has such a low profile, it is not susceptible to damage during routine handling, nor is it susceptible to becoming dislodged or inadvertently misaligned during the printed circuit board manufacturing process. Moreover, since the substantially zero signal degradation solder bridge electrical connections 36, 42 form a short, direct electrical connection between the conducting pads 18-28, degradation of the integrity of the electrical signal and parasitic capacitance and inductance between connected conducting pads is minimized especially when compared to the separate electrical components referred to above. Further, it is relatively easy to reconfigure the printed circuit board 10 during the manufacturing process since the reconfiguring of any substantially zero signal degradation electrical connections only requires modification of the stencil 44 which may in some instances be accomplished simply by masking off with tape 60 unwanted solder bridge fabrication openings 50, 52 in the stencil 44. Lastly, these substantially zero signal degradation electrical connections 36, 42 are rotatable through any angle so as to be mountable to the printed circuit board 10 at any angle (not just 90° and 180°) to allow the printed circuit board 10 to employ various conducting pad geometries and groupings to take advantage of available printed circuit board surface space.

Although the present invention has been described with reference to preferred embodiments, workers skilled in the art will recognize that changes may be made in form and detail without departing from the spirit and scope of the invention.

The invention claimed is:

1. A stencil device for aiding in the application of solder paste to a printed circuit board, the printed circuit board being defined by a dielectric structure core having a first surface, the first surface including a first conducting pad and a second conducting pad adjacent to the first conducting pad, the first and second conducting pads defining therebetween a surface area of the first surface, the stencil device comprising:

a stencil plate member defining a first opening having an edge and sized to substantially correspond to the first conducting pad, a second opening having an edge separated from the edge of the first opening by less than 12 mils, adjacent to the edge of the first opening and sized to substantially correspond to the second conducting pad, and a third opening that links the adjacent first and second openings and is sized to correspond to a partial portion of the surface area of the first surface between the adjacent first and second conducting pads, such that upon application of solder paste to the stencil plate member, the solder paste flows through the first, second and third openings onto the first and second conducting pads and the first surface of the dielectric structure core to form a substantially zero signal degradation electrical connection between the first and second conducting pads.

2. A stencil device for aiding in the application of solder paste is accurately applied to a printed circuit board, the printed circuit board being defined by a dielectric structure core having a first surface, the first surface including a first conducting pad and a second conducting pad adjacent to the first conducting pad, the first and second conducting pads defining therebetween a surface area of the first surface, the stencil device comprising:

a stencil plate member capable of positioning adjacent to the first surface of the dielectric core and defining a first opening having an edge and sized to correspond to a partial portion of a surface area of the first conducting pad, a second opening having an edge separated from the edge of the first opening by less than 12 mils and sized to correspond to a partial portion of a surface area of the second conducting pad, and a third opening that links the first and second openings and is sized to correspond to a partial portion of the surface area of the first surface between the first and second conducting pads, the stencil plate permitting the solder paste to flow through the first, second, and third openings on to a portion of the first and second conducting pads and a portion of the first surface of the dielectric structure core to form a substantially zero signal degradation electrical connection between the first and second conducting pads.

3. The stencil device of claim 2, wherein the first opening is sized to substantially correspond to the first conducting pad.

4. The stencil device of claim 2, wherein the second opening is sized to substantially correspond to the second conducting pad.

5. The stencil plate of claim 2, wherein the third opening is sized to substantially correspond to the surface area of the first surface between the first and second conducting pads.

6. The stencil plate of claim 2, wherein the first opening is sized to substantially correspond to the first conducting pad and the second opening is sized to substantially correspond to the second conducting pad.

7. The stencil device of claim 2, wherein the first opening is sized to substantially correspond to the first conducting pad and the third opening is sized to substantially correspond to the surface area of the first surface between the first and second conducting pads.

8. The stencil device of claim 2, wherein the second opening is sized to substantially correspond to the second conducting pad and the third opening is sized to substantially correspond to the surface area of the first surface between the first and second conducting pads.

* * * * *